US008849362B1

(12) United States Patent
Saji et al.

(10) Patent No.: US 8,849,362 B1
(45) Date of Patent: Sep. 30, 2014

(54) COMMUNICATION MODULE

(71) Applicant: Taiyo Yuden Co., Ltd., Tokyo (JP)

(72) Inventors: Tetsuo Saji, Tokyo (JP); Yohei Ichikawa, Tokyo (JP); Hiroshi Nakamura, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 14/199,824

(22) Filed: Mar. 6, 2014

(30) Foreign Application Priority Data

Oct. 30, 2013 (JP) ................................. 2013-225216

(51) Int. Cl.
*H04M 1/00* (2006.01)
*H04M 1/02* (2006.01)
*H01L 23/552* (2006.01)

(52) U.S. Cl.
CPC .................................. *H04M 1/0277* (2013.01)
USPC .......................... 455/575.1; 257/659; 257/660

(58) Field of Classification Search
CPC ............................... H04M 1/04; H04M 1/026
USPC .................................. 455/575.1; 257/659, 660
See application file for complete search history.

(56) References Cited

U.S. PATENT DOCUMENTS

2011/0304388 A1    12/2011   Yamawaki et al.
2011/0310585 A1*   12/2011   Suwa et al. ................... 361/820
2012/0139091 A1*   6/2012    Wakabayashi ................ 257/659
2012/0306062 A1*   12/2012   Kim et al. ..................... 257/659
2013/0012261 A1*   1/2013    Zhu et al. .................. 455/550.1
2013/0257462 A1*   10/2013   Ding et al. .................... 324/705

FOREIGN PATENT DOCUMENTS

| JP | H7-42187 U   | 7/1995  |
| JP | 2005-277939 A | 10/2005 |
| JP | 2012-4725 A  | 1/2012  |
| JP | 5285806 B1   | 9/2013  |

OTHER PUBLICATIONS

Japanese Office Action dated Dec. 11, 2013, in a counterpart Japanese patent application No. 2013-236650.

* cited by examiner

*Primary Examiner* — Andrew Wendell
*Assistant Examiner* — Maryam Soltanzadeh
(74) *Attorney, Agent, or Firm* — Chen Yoshimura LLP

(57) ABSTRACT

A communication module includes a circuit substrate having a first high-frequency processing section related to mobile phone communication, a system section having a baseband processing section and application processing section, and a power circuit section, a sealing member covering the electronic components mounted on the circuit substrate, a conductive shield layer formed on a surface of the sealing member, and a shield wall formed in the sealing member so as to demarcate one or both mounting areas of the system section and power circuit section and the mounting area of the first high-frequency processing section. The circuit substrate includes a core layer that is a conductive layer thicker than the other conductive layers and that functions as a ground. Electronic components are arranged in through-holes formed in the core layer.

15 Claims, 3 Drawing Sheets

COMMUNICATION MODULE

This application claims the benefit of Japanese Application No. 2013-225216, filed in Japan on Oct. 30, 2013, which is hereby incorporated by reference in its entirety.

BACKGROUND OF THE INVENTION

1. Field of the Invention

The present invention relates to a communication module used in mobile phones.

2. Description of Related Art

Recently, as shown by multi-functional mobile phones such as the smartphone, the functions of mobile phones are increasing and their size is decreasing. Known examples of such a mobile phone include a mobile phone in which a high-frequency circuit module that has various types of front end components necessary for transmission and reception of high-frequency signals mounted together on a circuit substrate is mounted on a motherboard (see Patent Document 1, for example). The term "front end components" means active or passive components for high-frequency signal processing that are arranged on a route between the high-frequency IC, which processes high-frequency signals, and the antenna. In a high-frequency circuit module disclosed in Patent Document 1, front end components such as a power amplifier IC, transmission filters, and reception filters are mounted on a circuit substrate. Passive components such as a capacitor forming a matching circuit are also embedded in the circuit substrate. The high-frequency circuit module in Patent Document 1 includes two transceiver systems, the digital cellular system operating in the 800 MHz band and the PCS (personal communication services) system operating in the 1.9 GHz band, and one reception system operating in the 1.5 GHz band for reception of GPS (global positioning system) signals in order to use positioning functions by the GPS.

RELATED ART DOCUMENT

Patent Document

Patent Document 1: Japanese Patent Application Laid-Open Publication No. 2005-277939

SUMMARY OF THE INVENTION

In the high-frequency circuit module disclosed in Patent Document 1, only the front end components are integrated; however, in order to achieve a further increase in mounting density and functionality, demand has recently emerged to have not only the front end components but almost all of the functions of a mobile phone, such as the high-frequency IC, power circuit, baseband signal processing circuit, and memory integrated on a single circuit substrate. However, if the high-frequency circuit module disclosed in Patent Document 1 has the baseband processing circuit, memory, and power circuit mounted thereon, and the total size is reduced, the following problems would occur: (a) characteristic degradation caused by noise mixing between the respective function parts due to the respective function parts being close to each other, (b) a reduction of heat dissipating efficiency due to the respective function parts being close to each other, and (c) susceptibility to warping during mounting due to the circuit substrate being larger than the preceding high-frequency circuit module, even though the size has been reduced.

In regards to problem (a), in this type of device a power circuit for supplying power to the high-frequency circuit and power circuits for the other circuits are provided as the power circuits, and in order for the device to be made smaller the power circuits are switching regulator circuits. Thus, the switching noise generated by the power circuits for the other circuits will electromagnetically couple with the power circuit that supplies power to the high-frequency circuit, resulting in possible degradation of high-frequency characteristics due to the switching noise being transmitted to the high-frequency circuit. It is also possible that the switching noise generated by the power circuit could cause degradation of the high-frequency characteristics by directly electromagnetically coupling with the high-frequency circuit.

The present invention was made in view of the above situation, and aims at providing a mobile phone communication module that is highly functional and compact.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, a communication module according to the present invention includes a circuit substrate having (a) a first high-frequency processing section that processes high-frequency signals related to mobile phone communication, (b) a system section having a baseband processing area that processes baseband signals related to mobile phone communication and an application processing area that processes various types of mobile phone application operations, and (c) a power circuit section; a sealing member formed on an entire surface of a main surface of the circuit substrate, the sealing member covering electronic components mounted on the main surface; a shield layer that is conductive and formed on a surface of the sealing member; and a first shield wall that fills a groove formed from the surface of the sealing member to the main surface side of the circuit substrate, the groove demarcating one or both mounting areas of the system section and the power circuit section and a mounting area of the first high-frequency processing section, the first shield wall being electrically connected to the above-mentioned shield layer, wherein the circuit substrate is made of conductive layers and insulating layers laminated together and has a core layer that is a conductive layer, the core layer being thicker than other conductive layers and functioning as a ground, and wherein one or more electronic components constituting a part of at least one of the first high-frequency processing section, system section, and power circuit section is arranged in a through-hole or a recessed portion formed in the core layer of the circuit substrate.

According to some aspects of the present invention, many of the primary function parts necessary for a mobile phone are integrated in one module; therefore, it is possible for this configuration to be highly functional and compact. In some aspects of the present invention, a groove is formed in the sealing member formed on a main surface of the circuit substrate, which is the component mounting surface, so as to demarcate one or both mounting areas of the system section and power circuit section and the mounting area of the first high-frequency processing section. The first shield wall is filled into this groove. This can prevent noise from entering the first high-frequency processing section from the system section and the power circuit section; thus, a configuration with excellent high-frequency characteristics is achieved.

Furthermore, in some aspects of the present invention, the circuit substrate is provided with a core layer that functions as a ground, and electronic components are arranged in through-holes or recessed portions formed in this core layer. Therefore, it is possible to have a higher mounting density and possible for the embedded electronic components to have high shielding characteristics. In some aspects of the present invention, the circuit substrate has a core layer, and thus, heat generated by the respective functional parts is transmitted to the core layer and then dispersed in the plane direction of this core layer. This increases heat dissipation efficiency. In some aspects of the present invention, a sealing member that covers the electronic components is formed on one entire surface of the circuit substrate. Therefore, this sealing member allows for a high heat dissipating efficiency. In some aspects of the present invention, the circuit substrate has a core layer; therefore, the circuit substrate is not susceptible to warping, and such warping of the circuit substrate can be suppressed by selecting an appropriate sealing member. A communication module according to some aspects of the present invention as described above can prevent characteristic degradation of high-frequency circuits, have high heat dissipating efficiency, and be resistant to warping regardless of many of the necessary primary function parts of the mobile phone being mounted together.

An example of a preferred embodiment of the present invention is a configuration in which the power circuit section includes a first power circuit area that powers the first high-frequency processing section, and a second power circuit area that powers the system section, and wherein a second shield wall is provided that fills a groove formed from the surface of the sealing member to the main surface side of the circuit substrate, the groove demarcating a mounting area of the first power circuit area and a mounting area of the second power circuit area, the second shield wall being electrically connected to the above-mentioned shield layer.

According to some aspects of the present invention, noise generated by the second power circuit area can be prevented from being transmitted to the first high-frequency processing section via the first power circuit area. Therefore, characteristic degradation of the high-frequency circuits can be further effectively prevented.

An example of a preferred embodiment of the present invention is a configuration provided with: a second high-frequency processing section that is mounted on the circuit substrate and processes high-frequency signals related to non-mobile phone communication; and a third shield wall that fills a groove formed from the surface of the sealing member to the main surface side of the circuit substrate, the groove demarcating one or both mounting areas of the system section and power circuit section and a mounting area of the second high-frequency processing section.

This can prevent noise from entering the second high-frequency processing section from the system section and the power circuit section; thus, a configuration with excellent high-frequency characteristics is achieved.

An example of a preferred embodiment of the present invention is a configuration in which the mounting area of the system section is arranged between the mounting area of the first high-frequency processing section and the mounting area of the second high-frequency processing section.

Generally, the antenna used for mobile phone communication and the antenna used for non-mobile phone communication, such as for the satellite positioning system, for example, are mounted as far away from each other as possible inside the casing of the mobile phone in order to prevent interference between the two. In some aspects of the present invention, the mounting area of the system section is interposed between the mounting area of the first high-frequency processing section for mobile phone communication and the mounting area of the second high-frequency processing section for non-mobile phone communication; therefore, the distance between the mounting area of the first high-frequency processing section and the mounting area of the second high-frequency processing section will inevitably be large. This makes it easy to mount the antennas as described above, and such a configuration will have excellent high-frequency characteristics due to the wiring length between the respective antennas and the high-frequency circuits being able to be shortened.

As described above, a communication module according to some aspects of the present invention can prevent characteristic degradation of high-frequency circuits, have high heat dissipating efficiency, and be resistant to warping regardless of many of the primary function parts necessary for the mobile phone being mounted together.

In another aspect, a communication module according to the present invention includes a circuit substrate having (a) a first high-frequency processing section that processes high-frequency signals related to mobile communication, (b) a system section having an application processing area that processes various types of application operations, and (c) a power circuit section, a sealing member formed on an entire surface of a main surface of the circuit substrate, the sealing member covering electronic components mounted on said main surface, a shield layer that is conductive and formed on a surface of the sealing member; and a first shield wall that fills a groove formed from the surface of the sealing member toward the main surface of the circuit substrate, the groove demarcating a mounting area of either one or both of the system section and the power circuit section and a mounting area of the first high-frequency processing section, the first shield wall being connected to the shield layer. The circuit substrate is made of conductive layers and insulating layers laminated together, and has a core layer that is thicker than other layers, and one or more electronic components constituting a part of at least one of the first high-frequency processing section, system section, and power circuit section are each arranged in a through-hole or a recessed portion formed in the core layer of the circuit substrate.

It is to be understood that both the foregoing general description and the following detailed description are exemplary and explanatory, and are intended to provide further explanation of the invention as claimed.

DETAILED DESCRIPTION OF THE PREFERRED EMBODIMENT

Figure 1:
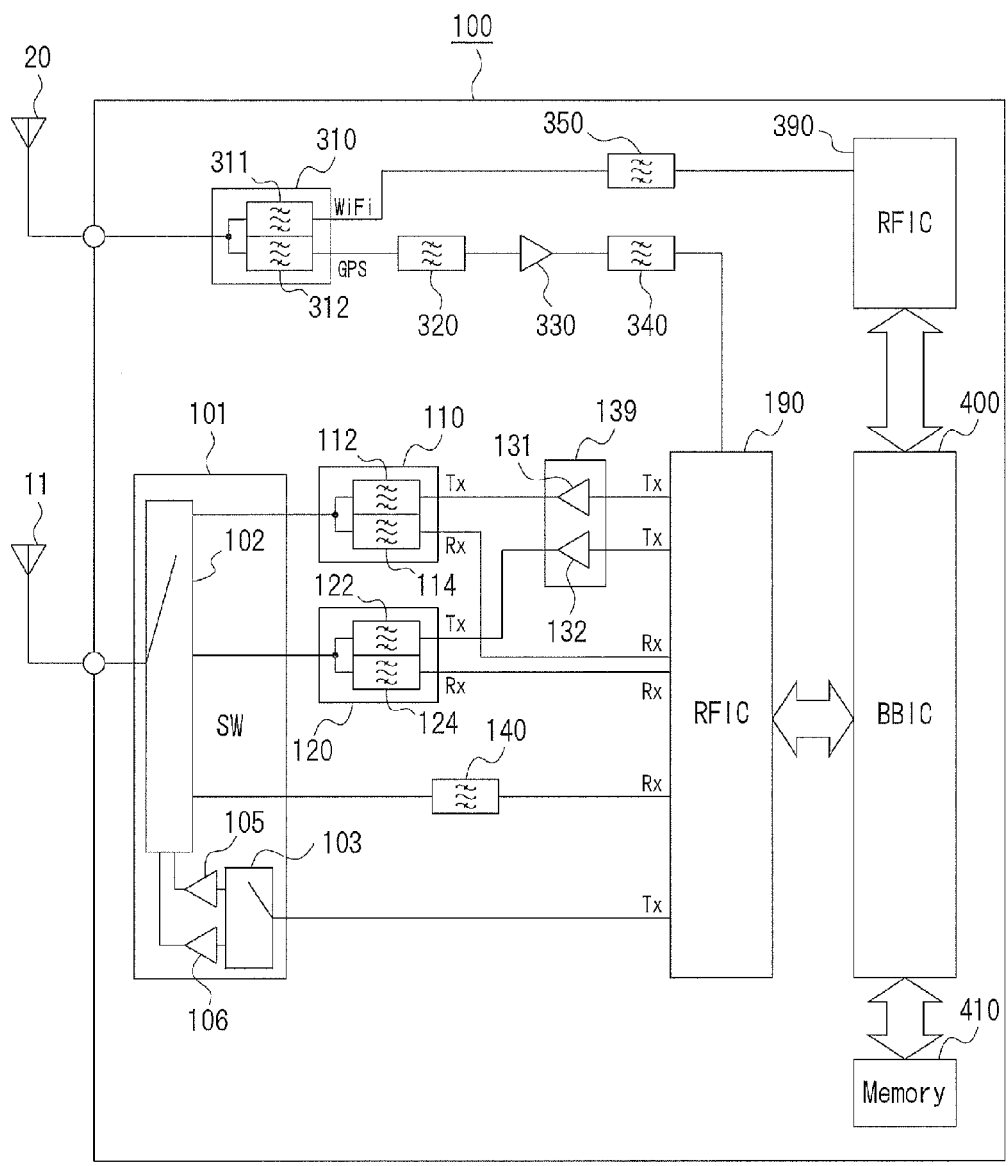
FIG. 1 is a schematic circuit diagram of a communication module.

A communication module according to an embodiment of the present invention will be explained with reference to figures. FIG. 1 is a schematic block view of the communication module. In the present embodiment, for ease of explanation, main configurations relating to the gist of the present invention will be explained.

A communication module 100 of the present embodiment has the primary functions of the multi-functional mobile phone, the smartphone, integrated into a single module. Specifically, the communication module 100 is provided with various functions such as speech communication on the mobile phone network, which is a broadband wireless communication network, WiFi (registered trademark), which is a form of short-range wireless communication, Bluetooth (registered trademark), and GPS, which is a satellite positioning system. For ease of explanation, the communication module 100 of the present embodiment is assumed to operate in the two W-CDMA (Wideband Code Division Multiple Access) frequency bands, two LTE (Long Term Evolution) frequency bands, and the two GSM (Global System for Mobile Communications) frequency bands.

As shown in FIG. 1, the communication module 100 includes a mobile phone network transceiver circuit. Specifically, the communication module 100 includes a high-frequency switch 101, first and second duplexers 110 and 120, high-frequency power amplifiers 131 and 132, and a first band-pass filter 140 as front end components. The communication module 100 also includes an RFIC (radio frequency integrated circuit) 190. As described later, the RFIC 190 processes GPS reception signals in addition to high-frequency signals related to mobile phone communication. The RFIC 190 is provided with a reception circuit and transmission circuit for high-frequency signals related to mobile phone communication, and performs modulation and demodulation of the high-frequency signals, and the like.

The communication module 100 also has a diplexer 310, second band-pass filter 320, low-noise amplifier 330, and third band-pass filter 340 as GPS front end components. A fourth band-pass filter 350 is provided as a WiFi front end component. As shown in FIG. 1, the diplexer 310 is also a front end component for WiFi and Bluetooth functionality. The communication module 100 also has an RFIC 390 for WiFi communication.

The communication module 100 further includes a memory 410, and a baseband IC 400, which is the central computing device responsible for processing functions (so-called baseband functions) of digital signals related to the respective communications and various types of application functions (such as camera control and imaging data processing) for the mobile phone.

In addition to the circuit components described above, the communication module 100 also has power circuits, clock circuits that form a reference for digital processing, and the like described later. These have been omitted in FIG. 1. In addition to the cell phone application as described above, the communication module 100 may be constituted of front end components and/or the RFIC (as primary components) for other high-frequency signal processing, such as forming a diversity reception circuit or a transceiver circuit for two-way simultaneous communication.

The high-frequency switch 101 has two embedded switches 102 and 103 and two high-frequency power amplifiers 105 and 106 in one package. The embedded switch 102 switches connection between an external antenna 11 and the first duplexer 110, second duplexer 120, first band-pass filter 140, and high-frequency power amplifiers 105 and 106. The embedded switch 103 switches connection between the two high-frequency power amplifiers 105 and 106 and the RFIC 190. The high-frequency power amplifier 105 amplifies transmission signals in the GSM frequencies that are greater than or equal to 1 GHz. The high-frequency power amplifier 106 amplifies transmission signals in the GSM frequencies that are less than 1 GHz. The embedded switch 103 is connected to the GSM transmission port of the RFIC 190. The transmission port is the same for the GSM 900 MHz band and 1900 MHz band.

The duplexers 110 and 120 are provided with respective transmission filters 112 and 122 and reception filters 114 and 124. Various types of acoustic wave filters such as SAW (surface acoustic wave) filters and BAW (bulk acoustic wave) filters can be used for the transmission filters 112 and 122 and the reception filters 114 and 124. In the present embodiment, SAW filters are used for the respective filters. In the present embodiment, the duplexers 110 and 120 use a configuration in which the respective transmission filters 112 and 122 and reception filters 114 and 124 are housed in a single package.

The transmission filters 112 and 122 are connected to the W-CDMA and LTE transmission ports of the RFIC 190 via the high-frequency power amplifiers 131 and 132. The respective reception filters 114 and 124 are connected to the reception ports of the RFIC 190. In the present embodiment, the reception filter 114 is connected to the W-CDMA and LTE reception port, and the reception filter 124 is connected to the W-CDMA, LTE, and GSM reception port. In the present embodiment, the high-frequency power amplifiers 131 and 132 are integrated into a single package as a power amp IC 139. The first band-pass filter 140 is connected to the GSM reception port of the RFIC 190. Various types of filters can be used for the first band-pass filter 140, including an acoustic wave filter such as a SAW filter or a BAW filter. In the present embodiment, a SAW filter is used for the band-pass filter.

As described above, the communication module 100 of the present embodiment operates in the two W-CDMA frequency bands, the two LTE frequency bands, and the two GSM frequency bands, and the duplexers 110 and 120 and band-pass filter 140 only allow high-frequency signals in these respective frequencies to pass through.

Specifically, the first duplexer 110 operates in the 2100 MHz W-CDMA (Wideband Code Division Multiple Access) and LTE (Long Term Evolution) bands. Accordingly, the first transmission filter 112 is a band-pass filter operating from 1920 to 1980 MHz, and the first reception filter 114 is a band-pass filter operating from 2110 to 2170 MHz. Meanwhile, the second duplexer 120 operates in the 900 MHz band of W-CDMA, LTE, and GSM. Accordingly, the second transmission filter 122 is a band-pass filter that operates in 880 to 915 MHz, and the second reception filter 124 is a band-pass filter that operates in 925 to 960 MHz.

The first band pass filter 140 is for filtering reception signals in the GSM 1900 MHz band and operates in 1930 to 1990 MHz.

The diplexer 310 is a device for branching high-frequency signals transmitted and received by an antenna 20 into high-frequency signals related to GSP reception signals and WiFi communication. The diplexer 310 includes a band-pass filter 312 that only allows GPS reception signals to pass through and a band-pass filter 311 that only allows high-frequency signals related to WiFi communication to pass through. In the present embodiment, the diplexer 310 has a configuration in which the band-pass filters 311 and 312 are housed in a single package. The diplexer 310 may be formed of a low-pass filter that allows GPS reception signals to pass while not allowing high-frequency signals related to WiFi communication to pass, and a high-pass filter that allows high-frequency signals related to WiFi communication to pass while not allowing GPS reception signals to pass.

The second band-pass filter 320 and third band-pass filter 340 are each filters for only allowing GPS reception signals to pass through. Various types of filters can be used for the respective band-pass filters 320 and 340, including an acoustic wave filter such as a SAW filter or a BAW filter. In the present embodiment, SAW filters are used for the respective filters. The third band-pass filter 340 is connected to the reception port of the RFIC 190. In the present embodiment, GPS front end components are configured as described above due to the weakness of the GPS reception signal and, as described later, the large distance between the terminal for connecting the antenna 20 and the RFIC 190; by introducing the low noise amplifier 330 together with the low-loss second band-pass filter 320, and by arranging these near the terminal for the antenna 20, good reception can be secured. Since the priority for the second band-pass filter 320 is to be low loss, it is difficult to ensure sufficient out-of-band suppression. As a countermeasure, in the present embodiment the third band-pass filter 340 with high out-of-band suppression is added.

The fourth band-pass filter 350 only allows high-frequency signals related to WiFi and Bluetooth to pass through. The fourth band-pass filter 350 is connected to the input/output port of the RFIC 390.

Figure 2:
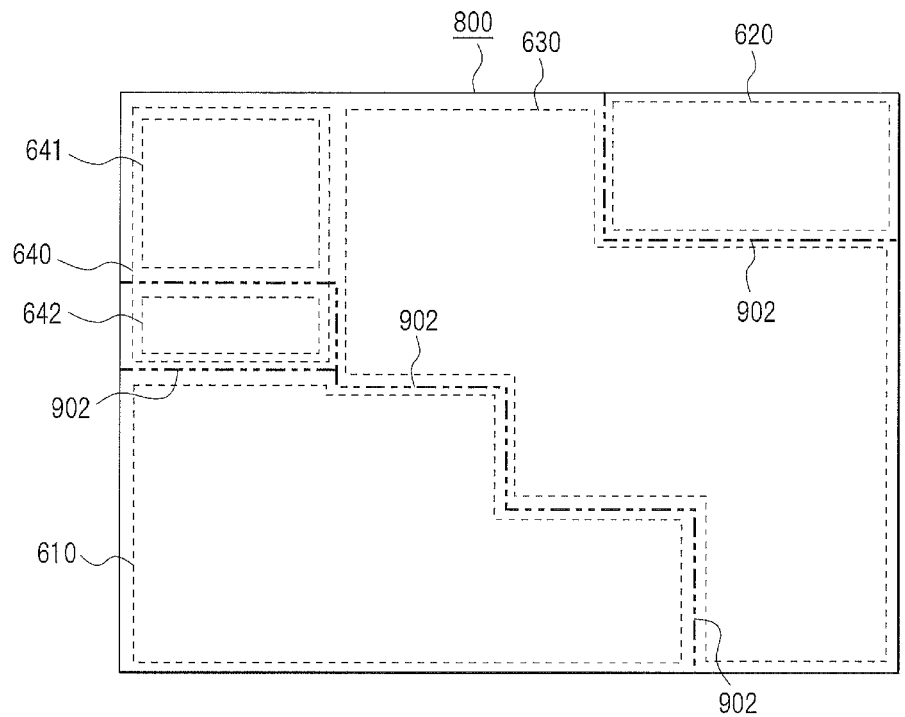
FIG. 2 is a plan view showing arrangement of respective functional blocks in the communication module.

The communication module 100 of the present embodiment has various types of components mounted on one main surface of a circuit substrate 800, and several components are embedded in the circuit substrate 800. The component mounting surface of the circuit substrate 800 is sealed with a sealing member such as a resin. A terminal electrode and ground electrode are formed on the other main surface of the circuit substrate 800. The communication module 100 is used with the other main surface of the circuit substrate 800 facing the parent circuit substrate where the communication module is to be mounted, and the terminal electrode and ground electrode being connected to the parent circuit substrate by a method such as soldering. The structure of the communication module 100 will be described below with references to FIGS. 2 and 3. FIG. 2 is a plan view showing arrangement of the respective functional blocks of the communication module, and FIG. 3 is a plan view of a state in which the sealing member has been removed, as seen from the component mounting surface of the communication module.

Figure 3:
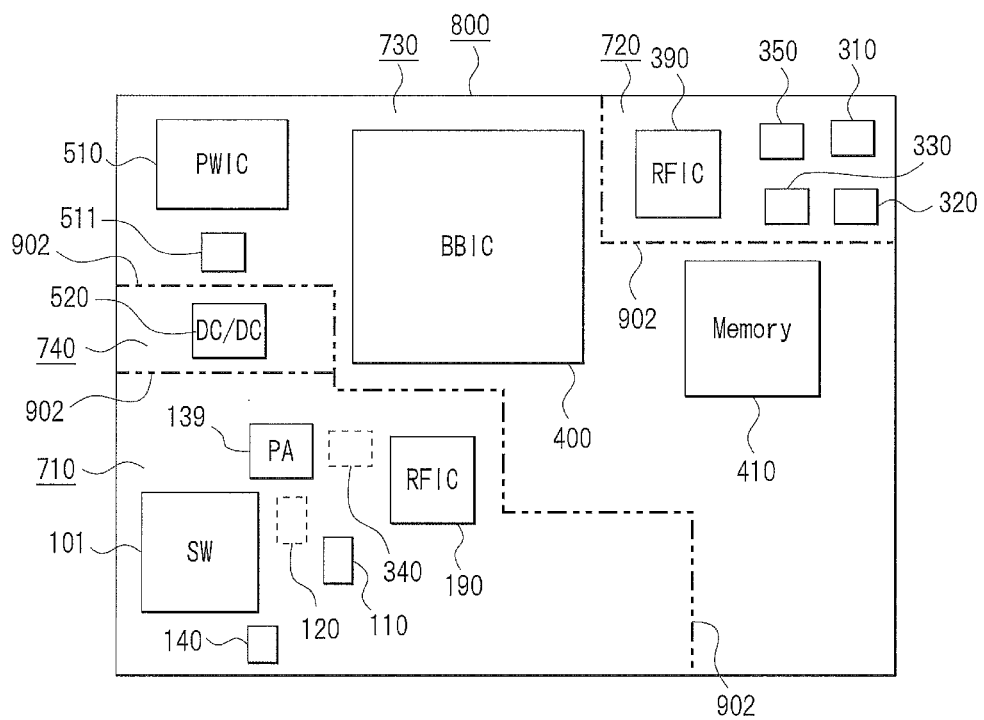
FIG. 3 is a plan view of a state in which a sealing member has been removed, as seen from the component mounting surface of the communication module.

As shown in FIGS. 2 and 3, the communication module 100 is functionally demarcated into: a first high-frequency processing section 610 formed on the lower left side of the horizontally long rectangular circuit substrate 800, which is where the mobile phone high-frequency circuits are mounted; a second high-frequency processing section 620 formed on the upper right of the circuit substrate 800, which is where the non-mobile phone high-frequency circuits are mounted; a system section 630 arranged from the center of the circuit substrate 800 to the top and to the right and where the baseband processing functions and application processing functions are mounted; and a power circuit section 640 that supplies power to each section, formed on the upper left of the circuit substrate 800.

The first high-frequency processing section 610 is adjacent to the system section 630 and power circuit section 640. As shown in FIG. 3, the high-frequency switch 101, duplexers 110 and 120, power amp IC 139, first band-pass filter 140, and RFIC 190 described above are provided in the first high-frequency processing section 610. The third band-pass filter 340, which is one of the non-mobile phone high-frequency circuit components, is also provided in the first high-frequency processing section 610. The high-frequency switch 101, first duplexer 110, power amp IC 139, and RFIC 190 are mounted on the surface of the circuit substrate 800. Meanwhile, the second duplexer 120 and third band-pass filter 340 are embedded in the circuit substrate 800. A terminal (not shown) for connecting with the antenna 11 is formed on the bottom of the first high-frequency processing section 610 in the circuit substrate 800. As described above, if the RFIC and front end components for forming the diversity reception circuit and two-way synchronous communication transceiver are provided, then the transceiver circuit may be disposed in the first high-frequency processing section 610.

As shown in FIG. 2, the second high-frequency circuit section 620 is only adjacent to the system section 630. In other words, the second high-frequency processing section 620 is not adjacent to the first high-frequency processing section 610 or the power circuit section 640. As shown in FIG. 3, the diplexer 310, second band-pass filter 320, low-noise amplifier 330, fourth band-pass filter 350, and RFIC 390 described above are mounted on the surface of the second high-frequency processing section 620. A terminal (not shown) for connecting with the antenna 20 is formed on the bottom of the second high-frequency processing section 620 in the circuit substrate 800.

As shown in FIG. 2, the system section 630 is adjacent to the first high-frequency processing section 610, second high-frequency processing section 620, and power circuit section 640. It should be noted that the system section 630 is between the first high-frequency processing section 610 and second high-frequency processing section 620. As shown in FIG. 3, the baseband IC 400 and memory 410 described above are mounted on the surface of the system section 630. It should be noted that the baseband functions and application functions are integrated into the baseband IC 400.

As shown in FIG. 2, the power circuit section 640 is functionally demarcated into a first power circuit area 641 that supplies power to the system section 630 and second high-frequency processing section 620, and a second power circuit area 642 that supplies power to the first high-frequency processing section 610. The first power circuit area 641 is adjacent to the system section 630 and second power circuit area 642, but not adjacent to the first high-frequency processing section 610 or second high-frequency processing section 620. Meanwhile, the second power circuit area 642 is adjacent to the system section 630, first power circuit area 641, and first high-frequency processing section 610, but not adjacent to the second high-frequency processing section 620. As shown in FIG. 3, various types of electronic components are mounted on the first power circuit area 641, such as a conventional power management IC 510 for the main power supply, a system clock oscillator 511, and an inductor for switching processing (not shown). Various types of electronic components are mounted on the second power circuit area 642, such as a conventional DC/DC converter 520 and an inductor (not shown) for switching processing of the DC/DC converter 520.

As shown in FIG. 2, the communication module 100 of the present embodiment has each section functionally demarcated, but these sections are also electrically and physically demarcated. In the present embodiment, the communication module 100 is demarcated into a first area 710 where the first high-frequency processing section 610 is formed, a second area 720 where the second high-frequency processing section 620 is formed, a third area 730 where the first power circuit area 641 of the power circuit section 640 and the system section 630 are formed, and a fourth area 740 where the second power circuit area 642 of the power circuit section 640 are formed. As described later, after the various components mounted on the surface of the circuit substrate 800 are sealed with a sealing member such as a resin, grooves are formed in the sealing member that reach the surface of the circuit substrate 800 so as to demarcate the respective areas 710 to 740. The entire surface of the sealing member is covered with a conductive material to form a shield layer, and a conductive material is also filled into the grooves to form shield walls 902. This demarcates the respective areas 710 to 740. A ground electrode set as the reference potential (ground potential) is formed on the surface of the circuit substrate 800 corresponding to the formation positions of the shield walls 902 in order to electrically connect with the shield walls 902.

Figure 4:
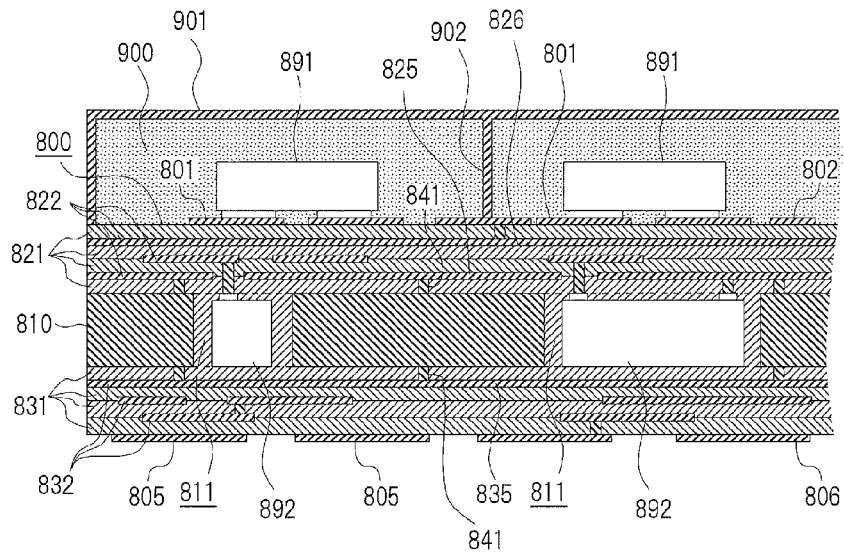
FIG. 4 is a cross-sectional view of the communication module.

Next, the structure of the circuit substrate will be explained with reference to FIG. 4. FIG. 4 is a cross-sectional view of the communication module. The circuit substrate 800 is a multilayer substrate formed by alternately laminating insulating layers and conductive layers. As shown in FIG. 4, the circuit substrate 800 includes a core layer 810 that is a relatively thick metal conductive layer with good conductive characteristics, a plurality of insulating layers 821 and conductive layers 822 formed on one main surface (top surface) of the core layer 810, and a plurality of insulating layers 831 and conductive layers 832 formed on the other main surface (bottom surface) of the core layer 810. The insulating layers 821 and 831 and the conductive layers 822 and 832 are formed on both main surfaces of the core layer 810 using the build-up method. Two of the conductive layers 822 positioned between the core layer 810 and one main surface (top surface) of the circuit substrate 800 act as ground conductive layers 825 and 826 provided with a reference potential (ground), and one layer of the conductive layers 832 between the core layer 810 and other main surface (bottom surface) of the circuit substrate 800 also acts as a ground conductive layer 835. The ground conductive layers 825 and 835 are the closest conductive layers 822 and 832 to the core layer 810, and each is connected to the core layer 810 through via conductors 841. Accordingly, the core layer 810 also functions as a ground conductor. There is also a conductive layer 822 between the two ground conductive layers 825 and 826, and the wiring line formed in this conductive layer 822 can be made to function as a strip line. Conductive lands 801 for component mounting and wiring 802 are formed on one main surface (the top surface) of the circuit substrate 800. Terminal electrodes 805 and ground electrodes 806 for connecting to a mother board are formed on the other main surface (bottom surface) of the circuit substrate 800. Surface mounted components 891 such as the RFIC 190 and baseband IC 400 are soldered to the lands 801.

Through-holes 811 for housing components are formed in the core layer 810. Embedded electronic components 892 such as the passive components such as the SAW filters, capacitor, and inductor, and active components such as the power amp IC are arranged inside the through-holes 811. In the present embodiment, the second duplexer 120 and third band-pass filter 340 are arranged inside the through-holes 811. Accordingly, it is preferable that the core layer 810 be thicker than the height of the embedded electronic components 892. In the present embodiment, the core layer 810 is made of a metal plate, or more specifically a metal plate made of a copper or a copper alloy. Spaces around the stored components in the through-holes 811 are filled with an insulating member such as a resin.

A sealing member 900 that seals the surface mounted components 891 is formed on the top of the circuit substrate 800, or namely, the component mounting surface. An example of the material for the sealing member 900 is an insulating resin such as an epoxy resin with silica or alumina added. The conductive shield layer 901 is formed on the surface of the sealing member 900. The shield wall 902 for demarcating the respective areas 710 to 740 described above is formed integrally with the shield layer 901 in the sealing member 900. The bottom end of the shield wall 902 is connected with the ground electrode on top of the circuit substrate 800.

As described above, according to the communication module 100 of the present embodiment, many of the primary function parts necessary for a mobile phone can be integrated on a single communication module, thereby allowing for high-functionality and a decrease in size. In the present embodiment, the shield wall 902 is formed in the sealing member 900, which is formed on one main surface that is a component mounting surface of the circuit substrate 800, so as to demarcate the first high-frequency processing section 610, the system section 630, and the power circuit section 640. This can prevent noise from entering the first high-frequency processing section 610 from the system section 630 and the power circuit section 640; thus, a configuration with excellent high-frequency characteristics is achieved. In the present embodiment, in a similar manner, the shield wall 902 is formed so as to demarcate the second high-frequency processing section 620 and the system section 630, resulting in a configuration with even greater high-frequency characteristics. In the present embodiment, in a similar manner, the shield wall 902 is formed so as to demarcate the first power circuit area 641 and second power circuit area 642, resulting in a configuration with even greater high-frequency characteristics.

In the present embodiment, the circuit substrate 800 includes the core layer 810 functioning as a ground, and electronic components are arranged inside the through-holes 811 formed in the core layer 810. Therefore, a configuration is provided that has a higher mounting density and in which the embedded electronic components have high shielding characteristics. In the present embodiment, the circuit substrate 800 includes the core layer 810; thus, heat generated by the respective function parts is transmitted to the core layer 810 and diffused in the plane direction in the core layer 810. This increases heat dissipation efficiency. In the present embodiment, the sealing member 900 covering the electronic components is formed on one entire surface of the circuit substrate 800. Therefore, a high heat dissipating efficiency can be achieved due to the sealing member 900.

In the present embodiment, the circuit substrate 800 includes the core layer 810, and therefore, the circuit substrate 800 is not susceptible to warping, and selecting a suitable sealing member 900 makes it possible to suppress warping of the circuit substrate.

As described above, the communication module 100 according to the present embodiment can prevent characteristic degradation of the high-frequency circuit, have high heat dissipating efficiency, and be resistant to warping regardless of many of primary function parts necessary for the mobile phone being integrated.

One embodiment of the present invention was described above, but the present invention is not limited thereto. In the embodiment above, forming the core layer 810 of copper or a copper alloy was described as an example, but there is no limitation on the material, and other metals, alloys, or resins can be used. In the embodiment described above, the surface mounted components 891 were sealed by a sealing member 900 on the top of the circuit substrate 800, but a conductive case may be attached so as to cover the entire top surface or a portion of the top surface of the circuit substrate 800. In this case, it is preferable that a conductive partitioning wall also be provided in the case so as to correspond with the shield wall 902.

Figure 5:
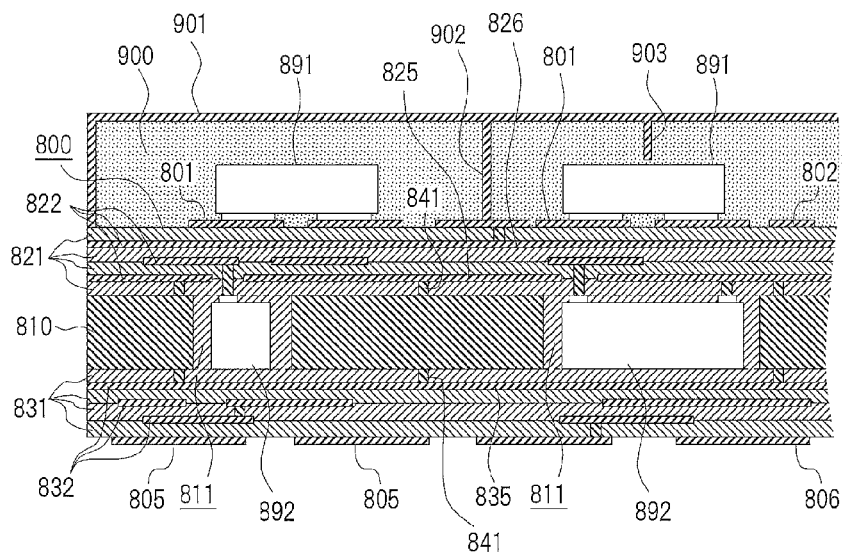
FIG. 5 is a cross-sectional view of a communication module according to a modification example.

In the embodiment described above, the shield wall 902 is provided that extends from the shield layer 901 on the surface of the sealing member 900 to the ground electrode above the circuit substrate 800 in order to electrically and physically demarcate the areas, but as shown in FIG. 5, a shield wall 903 may stretch from the shield layer 901 of the surface of the sealing member 900 to substantially the midpoint in the thickness direction of the sealing member 900. The shield wall 903 has slightly inferior electrical and physical shielding characteristics to the shield wall 902, but the surface mounted components 691 can be arranged under this shield wall 903. Accordingly, in the communication module 100 according to the embodiment described above, electrical characteristics can be improved while maintaining mounting density by appropriately adding the shield wall 903 without changing the shield wall 902, arrangement of the components, and the like. In the embodiment described above, the first power circuit area 641 of the power circuit section 640 and the system section 630 are mounted in the same area 730 demarcated by the shield wall 902, for example, but it is possible for the shield wall 903 to be formed so as to demarcate the first power circuit area 641 of the power circuit section 640 and the system section 630.

The circuits of the embodiment described above are merely examples, and the present invention can be implemented even with other circuit configurations. Furthermore, which components to embed may be chosen as appropriate in consideration of mounting density, shielding characteristics, heat dissipating characteristics, and the like.

The arrangements of the respective function parts in the embodiment described above are merely examples, and some aspects of the present invention can be implemented even with other arrangement configurations. In the embodiment described above, the system section 630 was arranged between the first high-frequency processing section 610 and second high-frequency processing section 620, but the first high-frequency processing section 610 and second high-frequency processing section 620 may be adjacent. In this case, the shield wall 902 may be formed so as to electrically and physically demarcate the respective processing sections 610 and 620 as necessary.

In the embodiment described above, the first and second duplexers 110 and 120 have the respective transmission filters 112 and 122 and reception filters 114 and 124 housed in a single package, but each may use individual filters.

In the embodiment described above, the through-holes 811 are formed in the core layer 810, and electronic components such as the second duplexer 120 are arranged in these through-holes 811, but recessed portions may be formed in the core layer 810 instead of the through-holes 811, and the respective electronic components may be arranged in these recessed portions.

In the embodiment described above, the baseband functions, which are digital signal processing functions related to communication, and the various types of application functions of the mobile phone are integrated into the single baseband IC 400, but the respective functions may be mounted with separate ICs.

The frequency bands in the embodiment described above are merely examples, and the present invention can be implemented even with other frequency bands. The GPS described in the embodiment above is merely an example of a satellite positioning system, and the present invention can be implemented even with other satellite positioning systems such as Russia's GLONASS and China's Compass. In the embodiment described above, duplexers were included as examples of branching filters (antenna duplexers), but the present invention can be implemented even with a branching filter that has three or more pass frequency bands such as a triplexer.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A communication module, comprising:
a circuit substrate having
(a) a first high-frequency processing section that processes high-frequency signals related to mobile phone communication,
(b) a system section having a baseband processing area that processes baseband signals related to mobile phone communication and an application processing area that processes various types of mobile phone application operations, and
(c) a power circuit section;
a sealing member formed on an entire surface of a main surface of the circuit substrate, the sealing member covering electronic components mounted on said main surface;
a shield layer that is conductive and formed on a surface of the sealing member; and
a first shield wall that fills a groove formed from the surface of the sealing member toward the main surface of the circuit substrate, the groove demarcating a mounting area of either one or both of the system section and the power circuit section and a mounting area of the first high-frequency processing section, the first shield wall being connected to the shield layer,
wherein the circuit substrate is made of conductive layers and insulating layers laminated together, and has a core layer that is a conductive layer, the core layer being thicker than other conductive layers and functioning as a ground, and
wherein one or more electronic components constituting a part of at least one of the first high-frequency processing section, system section, and power circuit section are each arranged in a through-hole or a recessed portion formed in the core layer of the circuit substrate.

2. The communication module according to claim 1, wherein a primary processing part of the baseband processing area and a primary processing part of the application processing area are integrated into one integrated circuit.

3. The communication module according to claim 1,
wherein the power circuit section includes a first power circuit area that powers the first high-frequency processing section, and a second power circuit area that powers the system section, and
wherein a second shield wall is provided that fills a groove formed from the surface of the sealing member toward the main surface of the circuit substrate, the groove demarcating a mounting area of the first power circuit area and a mounting area of the second power circuit area, the second shield wall being connected to the shield layer.

4. The communication module according to claim 2,
wherein the power circuit section includes a first power circuit area that powers the first high-frequency processing section, and a second power circuit area that powers the system section, and
wherein a second shield wall is provided that fills a groove formed from the surface of the sealing member toward the main surface of the circuit substrate, the groove demarcating a mounting area of the first power circuit area and a mounting area of the second power circuit area, the second shield wall being connected to the shield layer.

5. The communication module according to claim 1, further comprising:
a second high-frequency processing section that is included with the circuit substrate and that processes high-frequency signals related to non-mobile phone communication; and
a third shield wall that is connected with the shield layer and that fills a groove formed from the surface of the sealing member toward the main surface of the circuit substrate, the groove demarcating one or both mounting areas of the system section and power circuit section and a mounting area of the second high-frequency processing section.

6. The communication module according to claim 2, further comprising:
a second high-frequency processing section that is included with the circuit substrate and that processes high-frequency signals related to non-mobile phone communication; and
a third shield wall that is connected with the shield layer and that fills a groove formed from the surface of the sealing member toward the main surface of the circuit substrate, the groove demarcating one or both mounting areas of the system section and power circuit section and a mounting area of the second high-frequency processing section.

7. The communication module according to claim 3, further comprising:
a second high-frequency processing section that is included with the circuit substrate and that processes high-frequency signals related to non-mobile phone communication; and
a third shield wall that is connected with the shield layer and that fills a groove formed from the surface of the sealing member toward the main surface of the circuit substrate, the groove demarcating one or both mounting areas of the system section and power circuit section and a mounting area of the second high-frequency processing section.

8. The communication module according to claim 4, further comprising:
a second high-frequency processing section that is included with the circuit substrate and that processes high-frequency signals related to non-mobile phone communication; and
a third shield wall that is connected with the shield layer and that fills a groove formed from the surface of the sealing member toward the main surface of the circuit substrate, the groove demarcating one or both mounting areas of the system section and power circuit section and a mounting area of the second high-frequency processing section.

9. The communication module according to claim 5,
wherein the mounting area of the system section is arranged between the mounting area of the first high-frequency processing section and the mounting area of the second high-frequency processing section.

10. The communication module according to claim 6,
wherein the mounting area of the system section is arranged between the mounting area of the first high-frequency processing section and the mounting area of the second high-frequency processing section.

11. The communication module according to claim 7,
wherein the mounting area of the system section is arranged between the mounting area of the first high-frequency processing section and the mounting area of the second high-frequency processing section.

12. The communication module according to claim 8,
wherein the mounting area of the system section is arranged between the mounting area of the first high-frequency processing section and the mounting area of the second high-frequency processing section.

13. A communication module, comprising:
a circuit substrate having
(a) a first high-frequency processing section that processes high-frequency signals related to mobile communication,
(b) a system section having an application processing area that processes various types of application operations, and
(c) a power circuit section;
a sealing member formed on an entire surface of a main surface of the circuit substrate, the sealing member covering electronic components mounted on said main surface;
a shield layer that is conductive and formed on a surface of the sealing member; and
a first shield wall that fills a groove formed from the surface of the sealing member toward the main surface of the circuit substrate, the groove demarcating a mounting area of either one or both of the system section and the power circuit section and a mounting area of the first high-frequency processing section, the first shield wall being connected to the shield layer,
wherein the circuit substrate is made of conductive layers and insulating layers laminated together, and has a core layer that is thicker than other layers, and
wherein one or more electronic components constituting a part of at least one of the first high-frequency processing section, system section, and power circuit section are each arranged in a through-hole or a recessed portion formed in the core layer of the circuit substrate.

14. The communication module according to claim 13,
wherein the power circuit section includes a first power circuit area that powers the first high-frequency processing section, and a second power circuit area that powers the system section, and
wherein a second shield wall is provided that fills a groove formed from the surface of the sealing member toward the main surface of the circuit substrate, the groove demarcating a mounting area of the first power circuit area and a mounting area of the second power circuit area, the second shield wall being connected to the shield layer.

15. The communication module according to claim 13, further comprising:
a second high-frequency processing section that is included with the circuit substrate and that processes high-frequency signals; and
a third shield wall that is connected with the shield layer and that fills a groove formed from the surface of the sealing member toward the main surface of the circuit substrate, the groove demarcating one or both mounting areas of the system section and power circuit section and a mounting area of the second high-frequency processing section.

* * * * *